US009463997B2

(12) United States Patent
Shiobara et al.

(10) Patent No.: US 9,463,997 B2
(45) Date of Patent: Oct. 11, 2016

(54) COMPOSITE PARTICLE, METHOD OF PRODUCING SAME, RESIN COMPOSITION CONTAINING THE PARTICLE, REFLECTOR FORMED FROM THE COMPOSITION, AND LIGHT-EMITTING SEMICONDUCTOR DEVICE USING THE REFLECTOR

(71) Applicant: Shin-Etsu Chemical Co., Ltd., Chiyoda-ku (JP)

(72) Inventors: Toshio Shiobara, Annaka (JP); Yoshihiro Tsutsumi, Annaka (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/453,135

(22) Filed: Aug. 6, 2014

(65) Prior Publication Data

US 2015/0060918 A1    Mar. 5, 2015

(30) Foreign Application Priority Data

Aug. 28, 2013 (JP) ................................. 2013-176286

(51) Int. Cl.
*H01L 33/00* (2010.01)
*C03C 12/02* (2006.01)
(Continued)

(52) U.S. Cl.
CPC ............. *C03C 12/02* (2013.01); *C03B 19/108* (2013.01); *C03B 19/1065* (2013.01); *C08J 3/203* (2013.01); *C08K 3/0075* (2013.01); *C08K 3/22* (2013.01); *H01L 24/97* (2013.01); *H01L 33/60* (2013.01);
(Continued)

(58) Field of Classification Search
CPC ........ C03C 12/02; H01L 33/60; H01L 33/56; G02B 1/04; C03B 19/10

USPC ........ 257/98, 100; 252/582; 428/402; 66/17.2
See application file for complete search history.

(56) References Cited

U.S. PATENT DOCUMENTS 8,013,057 B2  9/2011  Taguchi et al.
8,684,071 B2  4/2014  Andersson et al.
(Continued)

FOREIGN PATENT DOCUMENTS

JP  2006-140207  6/2006
JP  2008-189833  8/2008
(Continued)

*Primary Examiner* — Caleb Henry
(74) *Attorney, Agent, or Firm* — Oblon, McClelland, Maier & Neustadt, L.L.P

(57) ABSTRACT

A composite oxide particle prepared from raw materials comprising: (1) a finely powdered silica having a BET specific surface area of 50 m²/g or greater or an alkoxysilane, and (2) a liquid metal alkoxide other than an alkoxysilane or a nano order metal oxide powder other than finely powdered silica, one of components (1) and (2) being a solid oxide and the other being a liquid alkoxide, wherein the composite oxide particle is prepared by mixing or kneading the raw materials to obtain a sol or gel-like substance, sintering the sol or gel-like substance at a temperature of 300° C. or higher to form a glass-like substance, and then crushing the glass-like substance is provided. Also, a resin composition containing the composite oxide particle, and a reflector for a light-emitting semiconductor device formed using the resin composition are provided. The invention is able to provide a resin composition which is ideal as a reflector material for a light-emitting semiconductor device that exhibits high light reflectance and minimal light transmission, and a composite oxide particle that is added to the resin composition.

23 Claims, 2 Drawing Sheets

(51) Int. Cl.
    *C03B 19/10*     (2006.01)
    *H01L 33/60*     (2010.01)
    *H01L 23/00*     (2006.01)
    *C08J 3/20*     (2006.01)
    *C08K 3/00*     (2006.01)
    *C08K 3/22*     (2006.01)
    *G02B 1/04*     (2006.01)

(52) U.S. Cl.
    CPC ......... *C08J 2300/24* (2013.01); *C08J 2383/06* (2013.01); *G02B 1/04* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2924/12042* (2013.01); *H01L 2924/15747* (2013.01); *H01L 2933/0058* (2013.01); *Y10T 428/2982* (2015.01)

(56) References Cited

U.S. PATENT DOCUMENTS

| | | | | |
|---|---|---|---|---|
| 2003/0200900 | A1* | 10/2003 | Korth | A61K 8/25 106/490 |
| 2005/0127814 | A1* | 6/2005 | Deguchi | B82Y 10/00 313/495 |
| 2005/0277717 | A1* | 12/2005 | Joshi | B60C 1/00 524/261 |
| 2007/0219314 | A1* | 9/2007 | Shinohara | C08G 18/289 524/612 |
| 2008/0255283 | A1 | 10/2008 | Aoki et al. | |
| 2010/0010116 | A1* | 1/2010 | Friehmelt | C08K 3/36 523/150 |
| 2010/0021694 | A1* | 1/2010 | Wakizaka | G02B 1/111 428/172 |
| 2012/0286220 | A1* | 11/2012 | Takasu | C08L 83/04 252/582 |
| 2013/0056788 | A1* | 3/2013 | Haraguchi | H01L 33/486 257/99 |

FOREIGN PATENT DOCUMENTS

| | | |
|---|---|---|
| JP | 2009-221393 | 10/2009 |
| JP | 4778058 | 9/2011 |
| JP | 4778085 B2 | 9/2011 |

* cited by examiner

Si mapping diagram for Example 1A

Ti mapping diagram for Example 1A

COMPOSITE PARTICLE, METHOD OF PRODUCING SAME, RESIN COMPOSITION CONTAINING THE PARTICLE, REFLECTOR FORMED FROM THE COMPOSITION, AND LIGHT-EMITTING SEMICONDUCTOR DEVICE USING THE REFLECTOR

BACKGROUND OF THE INVENTION

1. Field of the Invention

This invention relates to a reflector for a light-emitting semiconductor device that exhibits high light reflectance and is resistant to light transmission, a resin composition that is ideal for forming this reflector, and a composite particle that is added to the resin composition.

2. Description of the Related Art

Conventionally, reflectors for light-emitting semiconductor devices have typically been formed from compositions prepared by adding a white filler material such as titanium oxide, magnesium oxide or zinc oxide, and silica and the like to an epoxy resin or a silicone resin.

However, reflectors formed from a thermoplastic resin or an epoxy resin or the like have a problem in that, when a high-brightness LED or the like is installed, the resin degrades and yellows due to the effects of temperature and light (Patent Documents 1 and 2). Further, another problem arises because a large amount of a fine powder of titanium oxide or the like must be used to ensure a white color, and as a result, the flowability of the resin deteriorates, and when the reflector is molded by transfer or injection molding or the like, molding defects such as incomplete filling and voids tend to occur more frequently (Patent Document 3).

On the other hand, if a silicone resin is used, absolutely no discoloration of the reflector occurs even when a high-brightness LED is installed. However, if silica is used as a filler material, then a problem arises in that some of the emitted light escapes due to similar refractive index of silica to that of the silicone resin (Patent Document 4).

CITATION LIST

Patent Documents

Patent Document 1: JP 2006-140207 A
Patent Document 2: JP 2008-189833 A
Patent Document 3: JP 4,778,085 B
Patent Document 4: JP 2009-221393 A

BRIEF SUMMARY OF THE INVENTION

Accordingly, an object of the invention is to provide a resin composition which is ideal as a reflector material for a light-emitting semiconductor device that exhibits high light reflectance and is resistant to light transmission, and to provide a composite particle that is added to the resin composition.

As a result of intensive investigation based on the above circumstances, the present inventors have found that by using a composite particle described below, that was prepared by sintering a mixture comprising (1) a finely powdered silica having a BET specific surface area of 50 m²/g or greater, or an alkoxysilane, and (2) a liquid metal alkoxide other than the alkoxysilane, or a nano order metal oxide other than silicon dioxide (silica), a resin composition that is ideal as a reflector material for a light-emitting semiconductor device having a high light reflectance and a minimal light transmission could be obtained, thereby completed the invention.

In other words, the invention is as described below.

<1> A composite oxide particle prepared from raw materials comprising:
(1) at least one type of silicon-containing compound selected from among:
(1-1) finely powdered silica having a BET specific surface area of 50 m²/g or greater, and
(1-2) alkoxysilanes represented by general formula (1):

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and
(2) a metal compound selected from among:
(2-1) liquid metal alkoxides other than alkoxysilanes, and
(2-2) metal oxide powders with an average particle size within a range from 1 to 50 nm (0.001 to 0.05 μm) other than finely powdered silica (silicon dioxide),
one of components (1) and (2) being an oxide, and the other being an alkoxide, wherein
the composite particle is prepared by mixing or kneading the raw materials to obtain a sol or gel-like substance, subsequently sintering the sol or gel-like substance at a temperature of 300° C. or higher to form a glass-like substance, and then crushing the glass-like substance.

<2> A spherical composite oxide particle comprising a fused metal oxide and silica, wherein the spherical composite oxide particle is prepared from raw materials comprising:
(1) at least one type of silicon-containing compound selected from among:
(1-1) finely powdered silica having a BET specific surface area of 50 m²/g or greater, and
(1-2) alkoxysilanes represented by general formula (1):

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and
(2) at least one type of metal compound comprising a metal other than silicon, the metal compound being selected from among:
(2-1) liquid metal alkoxides other than alkoxysilanes, and
(2-2) metal oxide powders with an average particle size within a range from 1 to 50 nm other than silica,
one of components (1) and (2) being an oxide, and the other being an alkoxide, wherein
the spherical composite oxide particle is prepared by mixing or kneading the raw materials to obtain a sol or gel-like substance, and then melting and spheroidizing the sol or gel-like substance in a flame.

<3> A method of producing a composite oxide particle, the method comprising:
preparing a sol or gel-like substance by mixing or kneading raw materials comprising:
(1) at least one type of silicon-containing compound selected from among:
(1-1) finely powdered silica having a BET specific surface area of 50 m²/g or greater, and
(1-2) alkoxysilanes represented by general formula (1):

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and (2) at least one type of metal compound comprising a metal other than silicon, the metal compound being selected from among:

(2-1) liquid metal alkoxides other than alkoxysilanes, and (2-2) metal oxide powders with an average particle size within a range from 1 to 50 nm other silica, one of components (1) and (2) being an oxide, and the other being an alkoxide, subsequently sintering the sol or gel-like substance at a temperature of 300° C. or higher to form a glass-like substance, and then crushing the glass-like substance.

<4> A method of producing a spherical composite oxide particle comprising a fused metal oxide and silica, the method comprising:

preparing a sol or gel-like substance by mixing or kneading raw materials comprising:

(1) at least one type of silicon-containing compound selected from among:

(1-1) finely powdered silica having a BET specific surface area of 50 m²/g or greater, and (1-2) alkoxysilanes represented by general formula (1):

$$R^1{}_a Si(OR^2)_{4-a} \qquad (1)$$

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and (2) at least one type of metal compound comprising a metal other than silicon, the metal compound being selected from among:

(2-1) liquid metal alkoxides other than alkoxysilanes, and (2-2) metal oxide powders with an average particle size within a range from 1 to 50 nm other than silica, one of components (1) and (2) being an oxide, and the other being an alkoxide, and subsequently melting and spheroidizing the sol or gel-like substance in a flame.

<5> A thermosetting resin composition comprising:
(A) a thermosetting resin, and
(B) the composite oxide particle described in <1> above.

<6> A thermosetting resin composition comprising:
(A) a thermosetting resin, and
(B) the spherical composite oxide particle described in <2> above.

<7> A reflector for a light-emitting semiconductor device, formed from the thermosetting resin composition described in <5> above.

<8> A reflector for a light-emitting semiconductor device, formed from the thermosetting resin composition described in <6> above.

<9> A light-emitting semiconductor device in which a light-emitting semiconductor element is installed on the reflector for a light-emitting semiconductor device described in <5> above.

<10> A light-emitting semiconductor device in which a light-emitting semiconductor element is installed on the reflector for a light-emitting semiconductor device described in <6> above.

<11> A light-emitting semiconductor device in which a light-emitting semiconductor element is encapsulated with the thermosetting resin composition described in <5> above.

<12> A light-emitting semiconductor device in which a light-emitting semiconductor element is encapsulated with the thermosetting resin composition described in <6> above.

According to this invention, are provided a resin composition which is ideal as a reflector for a light-emitting semiconductor device that exhibits high light reflectance and is resistant to light transmission, and a composite particle that is added to the composition. Among the various possibilities, a spheroidized composite particle can be added to the resin in a large amount, and because the refractive index of the composite particle can be controlled freely by altering the blend ratio of the finely powdered silica having a BET specific surface area of 50 m²/g or greater or the alkoxysilane relative to the metal alkoxide or nano order metal oxide powder, light loss and light reflection deficiencies can be solved.

BRIEF DESCRIPTION OF THE DRAWINGS

FIG. 3 is a series of diagrams illustrating a reflector of Example 7, wherein

DETAILED DESCRIPTION OF THE INVENTION

Figure 1:
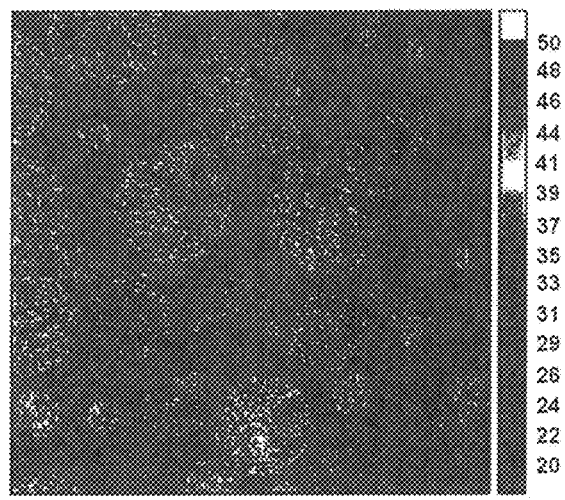
FIG. 1 is an electron microprobe analyzer (EPMA) mapping diagram of the silicon (Si) in the composite oxide particle obtained in Example 1A.

The invention is described below in detail.

[(1) Silicon-Containing Compound]

(1-1) Finely Powdered Silica Having a BET Specific Surface Area of 50 m²/g or Greater Representative examples of the finely powdered silica having a BET specific surface area of 50 m²/g or greater used in the invention include dry silica such as fumed silica obtained by spray combustion of silicon tetrachloride or a tetraalkoxysilane or the like at high temperature, precipitated silica obtained by reacting silicon tetrachloride or a tetraalkoxysilane with water and performing hydrolysis and condensation, and wet silica such as silica obtained by the sol-gel method. These types of silica are finely powdered silica having a large surface area.

Examples of commercially available finely powdered silica having a BET specific surface area of 50 m²/g or greater are typified by fumed silica, including hydrophilic fumed silica such as Aerosil 90, Aerosil 130 and Aerosil 380 (product names, manufactured by Nippon Aerosil Co., Ltd.), and hydrophobic fumed silica such as Aerosil R972 and Aerosil R974 (product names, manufactured by Nippon Aerosil Co., Ltd.) which are produced by chemically treating a hydrophilic fumed silica with an organosilicon compound such as a silane, a silazane or a siloxane. The specific surface area of these silica, which is typically reported as a specific surface area measured by the BET adsorption method, is 50 m²/g or greater, and may be an extremely large value of 100 to 400 m²/g. Further, the finely powdered silica having a BET specific surface area of 50 m²/g or greater is also typically referred to as nano silica, which describes silica having an average particle size of 0.1 μm (100 nm) or less, and in particular an average particle size of 0.001 to 0.05 μm (1 to 50 nm). This average particle size can usually be determined as the cumulative weight-average value $D_{50}$ (or median value) in a particle size distribution measurement performed using a laser diffraction method.

(1-2) Alkoxysilane

The alkoxysilane used in the invention is represented by general formula (1) shown below.

$$R^1{}_a Si(OR^2)_{4-a} \quad (1)$$

In the formula, each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3.

Examples of $R^1$ include alkyl groups such as a methyl group, ethyl group, propyl group, hexyl group and octyl group, cycloalkyl groups such as a cyclopentyl group and cyclohexyl group, alkenyl groups such as a vinyl group and allyl group, aryl groups such as a phenyl group and tolyl group, and aralkyl groups such as a 2-phenylethyl group and 2-methyl-2-phenylethyl group. Among these, a methyl group is preferable in terms of availability of the raw material.

Examples of $R^2$ include alkyl groups such as a methyl group, ethyl group, propyl group, butyl group, pentyl group and hexyl group. Among these, a methyl group is preferable in terms of availability of the raw material.

Further, a is preferably 0 to 2, more preferably 0 or 1, and most preferably 0.

Examples of commercially available alkoxysilanes represented by the above general formula (1) include products manufactured by Shin-Etsu Chemical Co., Ltd., including tetramethoxysilane marketed under the trade name KBM-04, tetraethoxysilane marketed under the trade name KBE-04, and methyltrimethoxysilane marketed under the trade name KBM-13.

[(2) Metal Compound]

The metal of the metal compound of component (2) is a metal other than silicon.

(2-1) Metal Alkoxide

In the metal alkoxide used in the invention, the metal that constitutes the metal alkoxide is preferably at least one metal selected from among titanium, aluminum, tantalum and zirconium. The metal alkoxide is preferably a liquid at room temperature. Specific examples of the metal alkoxide include tetraisopropoxy titanium, triisopropoxy aluminum (aluminum isopropoxide), tetra-n-butoxy zirconium and pentaethoxy tantalum (tantalum pentaethoxide), but this is not an exhaustive list. Among these compounds, tetraisopropoxy titanium, which is a liquid at room temperature, is preferable. In this invention, a single type of metal alkoxide may be used, or a combination of two or more types may be used.

(2-2) Nano Order Metal Oxide Powder

Examples of the nano order metal oxide powder other than silica used in the invention include metal oxides such as titanium dioxide, zinc oxide, aluminum oxide (fumed alumina), magnesium oxide and zirconium oxide. The term "nano order" describes particles having an average particle size within a range from 1 to 50 nm (0.001 to 0.05 μm). This average particle size can usually be determined as the cumulative weight-average value $D_{50}$ (or median value) in a particle size distribution measurement performed using a laser diffraction method.

Examples of the titanium dioxide used include very fine $TiO_2$ particles having an average particle size of approximately 25 nm, including the products marketed under trade names CR50, CR80 and R820 manufactured by Ishihara Sangyo Kaisha, Ltd., the products marketed under trade names R62N, GTR100, D918 and R39 manufactured by Sakai Chemical Industry Co., Ltd., and the product marketed under trade names Aeroxide $TiO_2$ P25 manufactured by Nippon Aerosil Co., Ltd. Both the rutile type and anatase type titanium dioxide can be used. Further, examples of the zinc oxide include very fine oxide powders having an average particle size of 25 nm or 35 nm such as the products MZ-306X and MZ-506X manufactured by Tayca Corporation. An example of a fumed alumina is the product SpectrAl 100 manufactured by Cabot Corporation.

It is preferable that the compounds described above are mainly used as the metal oxide powder, but compounds other than oxides, such as hydroxides, may also be used in combination with the metal oxide, provided that they do not impair the effects of the invention.

[Method of Producing Composite Oxide Particle]

In one example of the production of the composite oxide particle of the invention (hereafter also referred to as simply "the composite particle of the invention"), first, the component (1) comprising the finely powdered silica having a BET specific surface area of 50 m²/g or greater or the alkoxysilane, and the component (2) comprising a preferably liquid metal alkoxide other than an alkoxysilane, or a nano order metal oxide powder other than silica (wherein it is preferable that one of the components (1) and (2) is a solid oxide, and the other is a liquid alkoxide (including alkoxysilanes)) are mixed together uniformly in a high-speed mixer until a sol or gel-like substance is obtained. Subsequently, by placing the sol or gel-like substance mixture in a heat-resistant container such as a ceramic container, and then performing a sintering treatment at a high temperature of at least 300° C., preferably 400° C. or higher, and more preferably 600° C. or higher, a uniform sintered compact can be produced. By crushing this sintered compact to a fine powder using a crushing device such as a ball mill, a sintered composite oxide powder containing two or more types of uniformly dispersed oxides (namely, at least one type of silicon dioxide and one or more types of metal oxides containing a metal other than silicon) can be obtained.

There are various possible methods for producing the spherical composite oxide powder, and for example, by subjecting the sintered fine powder obtained by performing sintering and crushing in the manner described above to a melting and spheroidizing treatment at high temperature in a flame, a spherical composite oxide powder can be obtained.

In one example of a simple method, the spherical composite oxide powder can be obtained by producing a uniform sol or gel-like substance of the components (1) and (2) in a high-speed mixer or the like, and then subjecting this sol or gel-like substance to a melting and spheroidizing treatment at high temperature in a flame.

The melting and spheroidizing treatment is performed by melting the above sintered fine powder or the above sol or gel-like substance in a flame at 1,800° C. or higher. This temperature is preferably 2,000° C. or higher.

[Composite Oxide Particle]

The composite oxide particle of the invention has a silica ($SiO_2$) content of 10 to 99% by mass, preferably 10 to 90% by mass, more preferably 15 to 80% by mass, and particularly preferably 30 to 80% by mass, and has a content of other oxide(s) of 1 to 90% by mass, preferably 10 to 90% by mass, more preferably 20 to 85% by mass, and particularly preferably 20 to 70% by mass. A silica content of 30 to 80% by mass is particularly desirable, as it yields a composite oxide with stable properties.

If the silica content is less than 10% by mass, then the binding effect with the other oxide(s) is poor, whereas if the silica content exceeds 99% by mass, then the characteristic effects of the composite oxide particle of the invention may not be attainable.

In terms of the particle size of the composite particle, when the composite particle is used as a filler material for an LED reflector material, the maximum particle size is preferably not more than 150 μm, and the average particle size is preferably from 5 to 30 μm. The maximum particle size is more preferably not more than 100 μm, and still more preferably 75 μm or less. The shape of the composite oxide particle is preferably spherical in terms of enabling a large amount of the particle to be added to the resin, but crushed shapes can be used without any particular problems, provided they satisfy the particle size range described above. Further, a combination of spherical particles and crushed particles may also be used. The average particle size can be determined as the cumulative weight-average value $D_{50}$ (or median value) in a particle size distribution measurement performed using a laser diffraction method.

[Resin Composition]

Preferred examples of the resin to which the composite particle of the invention is added, in the case where the invention is used as a reflector material, include thermosetting resins such as epoxy resins, silicone resins, silicon-epoxy hybrid resins and cyanate resins, and thermoplastic resins such as polyphthalamides. Thermosetting silicone resins are particularly preferable. The composition may also include additives such as curing catalysts, release agents and coupling agents according to need.

The amount of the composite particle of the invention added per 100 parts by mass of the type of resin described above is typically from 50 to 1,200 parts by mass, and preferably from 100 to 1,000 parts by mass.

[Reflector]

The reflector of this invention may also include, besides the resin composition of the invention, conventional crystalline silica, fused silica, alumina, zinc oxide, zirconium oxide, glass fiber, carbon fiber, aluminum nitride, magnesium oxide and cristobalite and the like, provided these other components do not impair the properties of the reflector or the encapsulating agent.

Furthermore, a conventional material such as titanium oxide, aluminum, zinc oxide or carbon black can be used as a coloring material for the reflector. When a composite particle of the invention containing titanium oxide is used, there is no need to use a separate white pigment, but if it is desirable to further increase the whiteness, then additional titanium oxide may be added as a separate component. The amount of the coloring material to be added is preferably from 0.5 to 20 parts by mass relative to a value of 100 parts by mass of the resin.

The reflector for a light-emitting semiconductor device according to the invention can be produced by molding the resin composition of the invention on a silver-plated copper lead frame by transfer molding or injection molding or the like.

[Light-Emitting Semiconductor Device]

When the composite particle of the invention is used as a filler material in an encapsulating agent (namely, an encapsulating resin composition) for a light-emitting semiconductor element, the composite particle is preferably used in an amount of 0.1 to 500 parts by mass, and more preferably 0.5 to 300 parts by mass, relative to 100 parts by mass for the resin such as a transparent silicone resin, epoxy resin or silicone-epoxy hybrid resin.

The resin composition containing the added composite particle of the invention must be as transparent as possible following curing, and therefore the refractive index of the composite particle is preferably similar to the refractive index of the cured resin. Accordingly, for the composite particle used as a filler material in the encapsulating agent, the refractive index is preferably adjusted by altering the proportion of the inorganic particles relative to the silica to be combined with the inorganic particles.

For example, when the composite particle is added to a silicone resin having a refractive index of approximately 1.53, a crushed and/or spherical finely powdered composite oxide prepared by uniformly mixing 100 parts by mass of a finely powdered silica and 100 parts by mass of a finely powdered alumina, and then performing sintering and/or melting in a flame is preferable in terms of the transparency and heat dissipation properties.

When the aforementioned encapsulating agent is an encapsulating resin composition comprising a silicone resin, the encapsulating agent may also include, besides the composite particle of the invention, a phosphor such as YAG and/or an added finely powdered alumina or silica for the purposes of thixotropy control.

An example of the method used for encapsulating the light-emitting semiconductor element includes a method in which a silicone resin composition containing the composite particle of the invention is poured dropwise, using a discharge device such as a dispenser, into the concave portion of a reflector having a light-emitting semiconductor element installed thereon, and the composition is then heated at a temperature of 100° C. or greater for approximately 1 to 4 hours to cure the composition and complete the encapsulation.

EXAMPLES

The invention is specifically described below using a series of examples and comparative examples, but the invention is in no way limited by the examples presented below. The raw materials used were as follows.

(1) Hydrophilic fumed silica ($SiO_2$): manufactured by Nippon Aerosil Co., Ltd., trade name: Aerosil 380, specific surface area: approximately 380 m$^2$/g.

(2) Hydrophobic fumed silica ($SiO_2$): manufactured by Nippon Aerosil Co., Ltd., trade name: Aerosil R-812, solid at room temperature.

(3) Tetramethoxysilane ($Si(OCH_3)_4$): manufactured by Shin-Etsu Chemical Co., Ltd., trade name: KBM-04, liquid at room temperature.

(4) Tetraisopropoxy titanium ($Ti(O-i-C_3H_7)_4$): manufactured by Tokyo Chemical Industry Co., Ltd., liquid at room temperature.

(5) Aluminum isopropoxide ($Al(O-i-C_3H_7)_3$): manufactured by Tokyo Chemical Industry Co., Ltd., solid at room temperature.

(6) Fumed mixed oxide (a physical mixture of silica and alumina, $SiO_2/Al_2O_3$): manufactured by Nippon Aerosil Co., Ltd., trade name: Aerosil MOX 84, solid at room temperature.

(7) Hydrophilic fumed metal oxide ($TiO_2$): manufactured by Nippon Aerosil Co., Ltd., trade name: Aeroxide $TiO_2$ P25, solid at room temperature.

(8) Hydrophilic fumed alumina ($Al_2O_3$): manufactured by Nippon Aerosil Co., Ltd., trade name: Aeroxide Alu C, solid at room temperature.

(9) Fumed alumina ($Al_2O_3$): manufactured by Cabot Corporation, trade name: SpectrAl 100, solid at room temperature.

(10) Titanium dioxide ($TiO_2$): manufactured by Ishihara Sangyo Kaisha, Ltd., trade name: CR-60, solid at room temperature.

Example 1

As shown in Table 1, fumed silica ($SiO_2$) (Aerosil 380, manufactured by Nippon Aerosil Co., Ltd.) and tetraisopropoxy titanium ($Ti(O-i-C_3H_7)_4$) (manufactured by Tokyo Chemical Industry Co., Ltd.) and/or aluminum isopropoxide ($Al(O-i-C_3H_7)_3$) (manufactured by Tokyo Chemical Industry Co., Ltd.) were mixed together using a mixing device until a uniform mixture was obtained, thus producing a series of clay-like mixtures. Each of these mixtures was placed in a muffle furnace at 400° C., 600° C. or 800° C. and heat-treated for 5 hours, and was then cooled to room temperature to obtain a sintered product.

TABLE 1

| Component | Raw material (units: parts by mass) | Example 1A | Example 1B | Example 1C | Example 1D | Example 1E | Example 1F |
|---|---|---|---|---|---|---|---|
| (1) | Silica (Aerosil 380) | 50 | 70 | 50 | 70 | 50 | 70 |
| (2) | Tetraisopropoxy titanium | 50 | 30 | | | 25 | 15 |
| | Aluminum isopropoxide | | | 50 | 30 | 25 | 15 |

| Evaluation results | Example 1A | Example 1B | Example 1C | Example 1D | Example 1E | Example 1F |
|---|---|---|---|---|---|---|
| 400° C. | Some partially insufficient sintered product exist ||||||
| 600° C. | Vitrified ||||||
| 800° C. | ||||||

Following coarse crushing of the vitrified block produced by baking at 800° C. in each of Examples 1A to 1F, crushing was performed using a ball mill to produce crushed composite oxide particles. Analysis of the state of distribution within these powdered particles revealed that the aluminum element and the titanium element existed in a uniform distribution. The particle size distribution of each of the crushed particles is shown below in Table 2. The particle size distribution was determined on a mass basis using a laser diffraction type particle size distribution analyzer (Microtrac HRA (X-100) manufactured by Nikkiso Co., Ltd.). The numerical values in Table 2 indicate mass % values.

Comparative Example 1

Fifty parts by mass of fumed silica ($SiO_2$) (Aerosil 380, manufactured by Nippon Aerosil Co., Ltd.) and 50 parts by mass of tetraisopropoxy titanium ($Ti(O-i-C_3H_7)_4$) (manufactured by Tokyo Chemical Industry Co., Ltd.) were mixed together using a mixing device until a uniform mixture was obtained, thus producing a clay-like mixture. This mixture was placed in a muffle furnace at 200° C. and heat-treated for 5 hours, and was then cooled to room temperature. The obtained product had undergone absolutely no sintering, and was merely a powder that could easily be broken up by rubbing by hand.

Example 2

As shown in Table 3, tetramethoxysilane ($Si(OCH_3)_4$) (trade name: KBM-04, manufactured by Shin-Etsu Chemical Co., Ltd.) and a hydrophilic fumed metal oxide ($TiO_2$) (trade name: Aeroxide $TiO_2$ P25, manufactured by Nippon Aerosil Co., Ltd.) and/or a fumed alumina ($Al_2O_3$) (trade name: SpectrAl 100, manufactured by Cabot Corporation) were mixed together using a mixing device until a uniform mixture was obtained, thus producing a series of clay-like mixtures. Each of these mixtures was placed in a muffle furnace at 400° C., 600° C. or 800° C. and heat-treated for 5 hours, and was then cooled to room temperature to obtain a sintered product.

TABLE 2

| Particle size | Example 1A | Example 1B | Example 1C | Example 1D | Example 1E | Example 1F |
|---|---|---|---|---|---|---|
| greater than 150 μm | 4 | 3 | 5 | 2 | 2 | 1 |
| 100 to 150 μm | 16 | 12 | 10 | 5 | 8 | 6 |
| 75 to 100 μm | 27 | 23 | 25 | 10 | 12 | 13 |
| 50 to 75 μm | 23 | 35 | 31 | 20 | 27 | 32 |
| 30 to 50 μm | 14 | 20 | 21 | 30 | 20 | 24 |
| 10 to 30 μm | 10 | 6 | 7 | 21 | 15 | 15 |
| 1 to 10 μm | 5 | 1 | 1 | 10 | 12 | 7 |
| less than 1 μm | 1 | 0 | 0 | 2 | 4 | 2 |

TABLE 3

| Component | Raw material (units: parts by mass) | Example 2A | Example 2B | Example 2C | Example 2D | Example 2E | Example 2F |
|---|---|---|---|---|---|---|---|
| (1) | KBM-04 (Si(OCH$_3$)$_4$) | 50 | 30 | 50 | 30 | 50 | 20 |
| (2) | Aeroxide TiO$_2$ P25 (TiO$_2$) | 50 | 70 | | | 25 | 40 |
| | SpectrAl 100 (Al$_2$O$_3$) | | | 50 | 70 | 25 | 40 |

| Evaluation results | Example 2A | Example 2B | Example 2C | Example 2D | Example 2E | Example 2F |
|---|---|---|---|---|---|---|
| 400° C. | Some partially insufficient sintered products exist |||||||
| 600° C. | Vitrified |||||||
| 800° C. | | | | | | |

Following coarse crushing of the vitrified block produced by baking at 800° C. in each of Examples 2A to 2F, crushing was performed using a ball mill to produce crushed composite oxide particles 2A to 2F. Analysis of the state of distribution within these powdered particles revealed that the aluminum element and the titanium element existed in a uniform distribution. The particle size distribution of each of the crushed particles is shown below in Table 4. The particle size distribution was determined on a mass basis using a laser diffraction type particle size distribution analyzer (Microtrac HRA (X-100) manufactured by Nikkiso Co., Ltd.). The numerical values in Table 4 indicate mass % values.

TABLE 4

| Particle size | Example 2A | Example 2B | Example 2C | Example 2D | Example 2E | Example 2F |
|---|---|---|---|---|---|---|
| greater than 150 μm | 3 | 4 | 3 | 5 | 2 | 2 |
| 100 to 150 μm | 15 | 13 | 16 | 15 | 8 | 7 |
| 75 to 100 μm | 29 | 24 | 30 | 35 | 11 | 15 |
| 50 to 75 μm | 23 | 36 | 24 | 24 | 28 | 32 |
| 30 to 50 μm | 14 | 18 | 14 | 10 | 19 | 22 |
| 10 to 30 μm | 10 | 4 | 10 | 6 | 15 | 12 |
| 1 to 10 μm | 5 | 1 | 3 | 3 | 12 | 7 |
| less than 1 μm | 1 | 0 | 0 | 2 | 5 | 3 |

Comparative Example 2

Fifty parts by mass of tetramethoxysilane (Si(OCH$_3$)$_4$) (trade name: KBM-04, manufactured by Shin-Etsu Chemical Co., Ltd.) and 50 parts by mass of titanium dioxide (TiO$_2$) (trade name: CR-60, manufactured by Ishihara Sangyo Kaisha, Ltd.) were mixed together using a mixing device until a uniform mixture was obtained, thus producing a clay-like mixture. This mixture was placed in a muffle furnace at 200° C. and heat-treated for 5 hours, and was then cooled to room temperature. The obtained product had undergone absolutely no sintering, and was merely a powder that could easily be broken up by rubbing by hand.

Example 3

Each of the composite oxides obtained by baking at 400° C. in Examples 1A to 1F was crushed in a ball mill until a fine powder was obtained, and the crushed powder was then regulated using a sieve to obtain a particle size of 50 μm or less. Each of these powders was melted by sprinkling onto a flame at 2,000° C., and was then cooled, thereby producing a series of spherical composite oxides 3A to 3F. Each of these composite oxides was composed of particles having a spherical shape and a uniform composition distribution. The particle size distribution of each composite oxide is shown in Table 5. The numerical values in Table 5 indicate mass % values.

Figure 2:
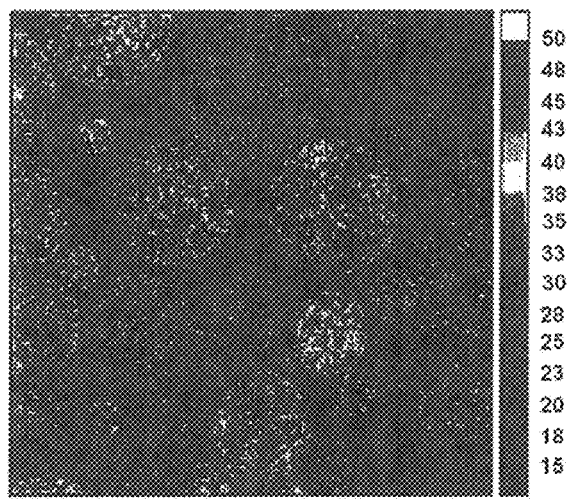
FIG. 2 is an electron microprobe analyzer (EPMA) mapping diagram of the titanium (Ti) in the composite oxide particle obtained in Example 1A.

In Example 1A, electron microprobe analyzer (EPMA) mapping diagrams of the silicon (Si) and the titanium (Ti) in the composite oxide obtained by baking at 400° C. are shown in FIG. 1 and FIG. 2 respectively.

TABLE 5

| Particle size | Example 3A | Example 3B | Example 3C | Example 3D | Example 3E | Example 3F |
|---|---|---|---|---|---|---|
| greater than 100 μm | 1 | 0 | 0 | 0 | 0 | 0 |
| 75 to 100 μm | 11 | 7 | 3 | 4 | 5 | 9 |
| 50 to 75 μm | 20 | 13 | 16 | 14 | 14 | 19 |
| 30 to 50 μm | 26 | 36 | 38 | 21 | 21 | 36 |
| 10 to 30 μm | 20 | 24 | 24 | 31 | 35 | 22 |
| 1 to 10 μm | 17 | 17 | 15 | 23 | 23 | 13 |
| less than 1 μm | 5 | 3 | 4 | 7 | 2 | 1 |

Example 4

Raw materials (mixed fine powders) having the blend ratio shown in Table 6 were granulated in the presence of a small amount of water using a granulator. Each of the obtained granular powders was melted by sprinkling onto a flame at 2,000° C., thus producing a series of spherical composite oxide particles 4A to 4D. The particle size distribution of each of the obtained composite particles is shown in Table 7.

TABLE 6

| Component | Raw material (units: parts by mass) | Example 4A | Example 4B | Example 4C | Example 4D |
|---|---|---|---|---|---|
| (1) | Silica (Aerosil 380) | 50 | 70 | 50 | 70 |
| (2) | Tetraisopropoxy titanium (Ti(O-i-C$_3$H$_7$)$_4$) | 50 | 30 | | |
| | Aluminum isopropoxide (Al(O-i-C$_3$H$_7$)$_3$) | | | 50 | 30 |

TABLE 7

| Particle size | Example 4A | Example 4B | Example 4C | Example 4D |
|---|---|---|---|---|
| greater than 150 μm | 2 | 0 | 1 | 0 |
| 100 to 150 μm | 4 | 2 | 5 | 1 |
| 75 to 100 μm | 11 | 14 | 18 | 8 |
| 50 to 75 μm | 31 | 35 | 38 | 21 |
| 30 to 50 μm | 21 | 21 | 21 | 30 |
| 10 to 30 μm | 17 | 15 | 11 | 25 |
| 1 to 10 μm | 11 | 11 | 5 | 12 |
| less than 1 μm | 3 | 2 | 1 | 3 |

Each of the components used in the following synthesis example, example and comparative example is listed below. In the following description, weight-average molecular weight values were measured under the following measurement conditions.

Developing solvent: tetrahydrofuran
Flow rate: 0.35 mL/min
Detector: RI
Column: TSK-GEL H-type (manufactured by Tosoh Corporation)
Column temperature: 40° C.
Sample injection volume: 5 μL (A) Synthesis of Organopolysiloxane

Synthesis Example 1

One hundred parts by mass of methyltrichlorosilane and 200 parts by mass of toluene were placed in a 1 L flask, and under cooling in ice, a mixed solution containing 8 parts by mass of water and 60 parts by mass of isopropyl alcohol was added dropwise to the flask over a period of 5 to 20 hours with the internal temperature maintained at −5 to 0° C. Subsequently, the resulting mixture was heated and stirred at the reflux temperature for 20 minutes. The mixture was then cooled to room temperature, 12 parts by mass of water was added dropwise over a period of 30 minutes at a temperature of 30° C. or lower, and the resulting mixture was stirred for 20 minutes. A further 25 parts by mass of water was then added dropwise, and the resulting mixture was stirred at 40 to 45° C. for 60 minutes. Subsequently, 200 parts by mass of water was added to the mixture, and the organic layer was separated. This organic layer was washed until neutral, and was then subjected to azeotropic dewatering, filtration and solvent stripping under reduced pressure, yielding 36.0 parts by mass of a thermosetting organopolysiloxane (A) represented by an average formula (A-1) shown below in the form of a colorless and transparent solid (melting point: 76° C., weight-average molecular weight: 3,060).

$(CH_3)_{1.0}Si(OC_3H_7)_{0.07}(OH)_{0.10}O_{1.4}$     (A-1)

Example 5

One hundred parts by mass of the organopolysiloxane (A) produced in Synthesis Example 1, (B) 750 parts by mass of the spherical composite oxide particle produced in Example 3A, (C) 2 parts by mass of a curing catalyst described below, (D) 2 parts by mass of a release agent described below, and (E) 0.5 parts by mass of a coupling agent described below were subjected to preliminary mixing, and were then kneaded using a continuous kneading device, thus producing a white thermosetting silicone resin composition.

(C) Curing Catalyst
Zinc benzoate (manufactured by Wako Pure Chemical Industries, Ltd.)
(D) Release Agent
Calcium stearate (manufactured by Wako Pure Chemical Industries, Ltd.)
(E) Coupling Agent
3-mercaptopropyltrimethoxysilane (product name: KBM-803, manufactured by Shin-Etsu Chemical Co., Ltd.)

Comparative Example 3

One hundred parts by mass of the organopolysiloxane (A) produced in Synthesis Example 1, (B) a mixed oxide containing 630 parts by mass of a fused spherical silica having an average particle size of 13 μm (product name: CS-6103 53C2, manufactured by Tatsumori Ltd.) and 120 parts by mass of titanium dioxide (product name: CR-95, manufactured by Ishihara Sangyo Kaisha, Ltd.), (C) 2 parts by mass of the above curing catalyst, (D) 2 parts by mass of the above release agent, and (E) 0.5 parts by mass of the above coupling agent were kneaded using a continuous kneading device, thus producing a white thermosetting silicone resin composition.

For the compositions of Example 5 and Comparative Example 3, the properties described below were measured. The results are shown in Table 8. All molding was performed using a transfer molding machine.

<Spiral Flow Value>
Using a molding die prescribed in the EMMI standards, the spiral flow value was measured under conditions including a molding temperature of 175° C., a molding pressure of 6.9 N/mm², and a molding time of 120 seconds.

<Melt Viscosity>
Using a Koka-type flow tester and a nozzle with a diameter of 1 mm, the viscosity at a temperature of 175° C. was measured under a pressure of 25 kgf.

<Flexural Strength and Flexural Modulus>
A test piece prepared by using a molding die prescribed in the JIS-K6911 standard to perform molding under conditions including a molding temperature of 175° C., a molding pressure of 6.9 N/mm² and a molding time of 120 seconds, and then performing post-curing at 180° C. for 4 hours, was measured for flexural strength and flexural modulus at room temperature.

<Light Reflectance and Light Transmittance>

A square-shaped cured product having a length along one side of 50 mm and a thickness of 0.35 mm was prepared under conditions including a molding temperature of 175° C., a molding pressure of 6.9 N/mm² and a molding time of 120 seconds, and the light reflectance and light transmittance for light of 450 nm were measured using an X-rite 8200 manufactured by S.D.G K.K.

TABLE 8

| Evaluation | Units | Example 5 | Comparative Example 3 |
|---|---|---|---|
| Spiral flow | inch | 21 | 22 |
| Melt viscosity | Pa · s | 72 | 80 |
| Flexural strength | MPa | 50 | 51 |
| Flexural modulus | MPa | 10,800 | 11,500 |
| 450 nm light reflectance | % | 96 | 92 |
| 450 nm light transmittance | % | 0.2 | 3.2 |

From the results in Table 8, it is evident that by using the composite oxide particle produced by the invention, the cured product of the resin composition can exhibit improved optical properties, and particularly light transmittance, while retaining other properties such as mechanical strength.

Example 6

(Molding of Reflector and Physical Properties Thereof)

Figure 3A:
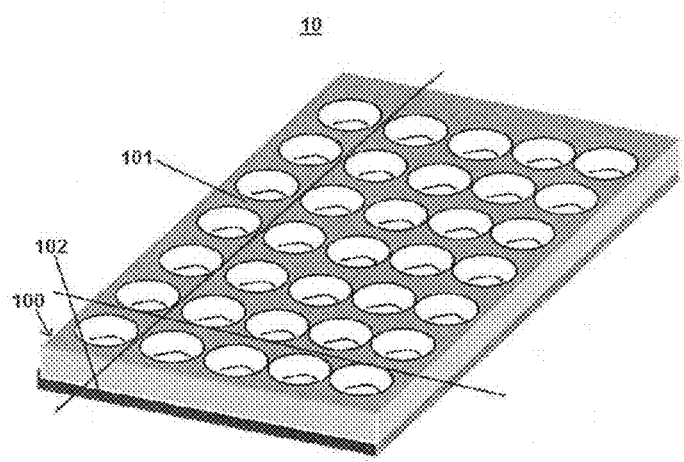
FIG. 3a illustrates a matrix type concave reflector substrate.
Figure 3B:
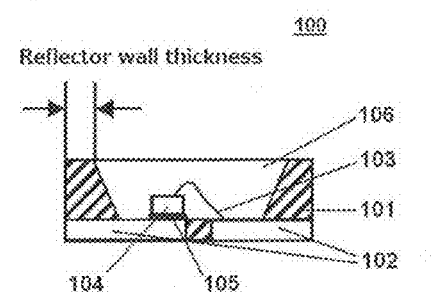
FIG. 3b is a cross-sectional view of a device in which an LED element has been installed on an individual reflector substrate.
Figure 3C:
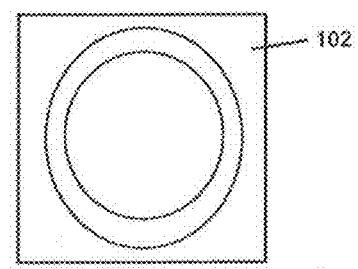
FIG. 3c is a plan view of the device shown in FIG. 3b.

Using the resin compositions produced in Example 5 and Comparative Example 3, and a totally silver-plated copper lead frame 102, a matrix type concave reflector 10 illustrated in FIG. 3 was prepared by transfer molding (by molding the encapsulating resin composition to have a thickness of 1 mm, a length of 38 mm and a width of 16 mm on top of the silver surface plated copper substrate) under the following molding conditions.

The molding conditions were as follows.
Molding temperature: 175° C.
Molding pressure: 70 kg/cm²
Molding time: 120 seconds Post curing was also performed at 180° C. for 4 hours.

<Warping Measurement>

Warping was measured in two diagonal directions on the resin surface side of the post-cured molded reflector having the shape described above, and the average of these two values was recorded. The results revealed a warping value of 250 μm for the resin composition produced in Example 5, and a warping value of 510 μm for the resin composition produced in Comparative Example 3, confirming that use of the composite oxide particle of the invention is also effective in yielding superior warping properties for the molded products of the resin composition.

Example 7

A blue LED element 104 was bonded, using a silicone die bonding agent 105 (trade name: LPS632D, manufactured by Shin-Etsu Chemical Co., Ltd.), to a portion of the lead frame 102 exposed within the concave bottom of each reflector 100 in the matrix type reflectors 10 molded using the resin compositions of Example 5 and Comparative Example 3, and the LED element electrode was connected electrically to another lead portion using a gold wire 103. Subsequently, a silicone encapsulating agent (LPS380, manufactured by Shin-Etsu Chemical Co., Ltd.) 106 was injected into the concave opening in which the LED element had been positioned, and curing was performed at 120° C. for 1 hour and then at 150° C. for 1 hour to encapsulate the LED element 104.

The matrix type reflectors were then divided into individual devices by dicing. Using five of these individual LED devices assembled from a reflector produced by molding the resin composition of Example 5 and Comparative Example 3 respectively, the brightness was measured using a CS-2000A device manufactured by Konica Minolta, Inc. When the brightness of the LED which used the reflector molded from the resin composition of Example 5 was deemed to be 100, the brightness of the LED prepared from the resin composition of Comparative example 3 was a lower value of 92. Further, when the lit LED was observed from the side surface of the LED package, the device produced using the reflector produced from the resin composition of Comparative Example 3 exhibited light leakage.

DESCRIPTION OF THE REFERENCE SIGNS

10: Concave reflector substrate
100: Divided individual concave reflector substrate
101: Resin composition
102: Lead frame
103: Gold wire
104: LED element
105: Die bonding agent
106: Transparent encapsulating resin

What is claimed is:

1. A composite oxide particle prepared from raw materials comprising:
   (1) at least one type of silicon-containing compound selected from among:
      (1-1) finely powdered silica having a BET specific surface area of 50 m²/g or greater, and
      (1-2) alkoxysilanes represented by general formula (1):

$$R^1_a Si(OR^2)_{4-a} \qquad (1)$$

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and
   (2) at least one type of metal compound comprising a metal other than silicon, the metal compound being selected from among:
      (2-1) liquid metal alkoxides other than alkoxysilanes, and
      (2-2) metal oxide powders with an average particle size within a range from 1 to 50 nm other than silica,
   one of components (1) and (2) being an oxide, and one other being an alkoxide, wherein
   the composite particle is prepared by mixing or kneading the raw material to obtain a sol or gel-like substance, subsequently sintering the sol or gel-like substance at a temperature of 300° C. or higher to form a glass-like substance, and then crushing the glass-like substance.

2. The composite oxide particle according to claim 1, wherein the metal oxide powder of component (2-2) is one or more powders selected from among titanium dioxide, magnesium oxide, zinc oxide and alumina, and the metal alkoxide of component (2-1) is one or more alkoxides selected from among aluminum alkoxides, zirconium alkoxides and titanium alkoxides.

3. The composite oxide particle according to claim 1, having a silica ($SiO_2$) content of 10 to 99% by mass, and a content of other metal oxides of 1 to 90% by mass.

4. A spherical composite oxide particle comprising a fused metal oxide and silica, wherein the spherical composite oxide particle is prepared from raw materials comprising:
(1) at least one type of silicon-containing compound selected from among:
(1-1) finely powdered silica having a BET specific surface area of 50 m²/g or greater, and
(1-2) alkoxysilanes represented by general formula (1):

$$R^1_a Si(OR^2)_{4-a} \qquad (1)$$

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and
(2) at least one type of metal compound comprising a metal other than silicon, the metal compound being selected from among:
(2-1) liquid metal alkoxides other than alkoxysilanes, and
(2-2) metal oxide powders with an average particle size within a range from 1 to 50 nm other than silica,
one of components (1) and (2) being an oxide, and one other being an alkoxide, wherein
the spherical composite oxide particle is prepared by mixing or kneading the raw material to obtain a sol or gel-like substance, and then melting and spheroidizing the sol or gel-like substance in a flame.

5. The spherical composite oxide particle according to claim 4, wherein the metal oxide powder of component (2-2) is one or more powders selected from among titanium dioxide, magnesium oxide, zinc oxide and alumina, and the metal alkoxide of component (2-1) is one or more alkoxides selected from among aluminum alkoxides, zirconium alkoxides and titanium alkoxides.

6. The spherical composite oxide particle according to claim 4, having a silica (SiO₂) content of 10 to 99% by mass, and a content of other metal oxides of 1 to 90% by mass.

7. The spherical composite oxide particle according to claim 4, wherein prior to the melting and spheroidizing in a flame, the sol or gel-like substance is sintered at a temperature of 300° C. or higher to form a glass-like substance, and the glass-like substance is then crushed.

8. A method of producing the composite oxide particle of claim 1, the method comprising:
preparing a sol or gel-like substance by mixing or kneading raw materials comprising:
(1) at least one type of silicon-containing compound selected from among:
(1-1) finely powdered silica having a BET specific surface area of 50 m²/g or greater, and
(1-2) alkoxysilanes represented by general formula (1):

$$R^1_a Si(OR^2)_{4-a} \qquad (1)$$

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and
(2) at least one type of metal compound comprising a metal other than silicon, the metal compound selected from among:
(2-1) liquid metal alkoxides other than alkoxysilanes, and
(2-2) metal oxide powders with an average particle size within a range from 1 to 50 nm other than finely powdered silica, one of components (1) and (2) being an oxide, and one other being an alkoxide,
subsequently sintering the sol or gel-like substance at a temperature of 300° C. or higher to form a glass-like substance, and then
crushing the glass-like substance.

9. A method of producing the spherical composite oxide particle of claim 4 comprising a fused metal oxide and silica, the method comprising:
preparing a sol or gel-like substance by mixing or kneading raw materials comprising:
(1) at least one type of silicon-containing compound selected from among:
(1-1) finely powdered silica having a BET specific surface area of 50 m²/g or greater, and
(1-2) alkoxysilanes represented by general formula (1):

$$R^1_a Si(OR^2)_{4-a} \qquad (1)$$

wherein each $R^1$ independently represents an unsubstituted or substituted monovalent hydrocarbon group of 1 to 15 carbon atoms, each $R^2$ independently represents an alkyl group of 1 to 6 carbon atoms, and a represents an integer of 0 to 3, and
(2) at least one type of metal compound comprising a metal other than silicon, the metal compound selected from among:
(2-1) liquid metal alkoxides other than alkoxysilanes, and
(2-2) metal oxide powders with an average particle size within a range from 1 to 50 nm other than silica,
one of components (1) and (2) being an oxide, and one other being an alkoxide, and
subsequently melting and spheroidizing the sol or gel-like substance in a flame.

10. The method according to claim 9, wherein the melting and spheroidizing in a flame is performed at a temperature of 1,800° C. or higher.

11. The method according to claim 9, further comprising a step, performed prior to the melting and spheroidizing in a flame, of sintering the sol or gel-like substance at a temperature of 300° C. or higher to form a glass-like substance, and then crushing the glass-like substance.

12. A thermosetting resin composition comprising:
(A) a thermosetting resin, and
(B) the composite oxide particle according to claim 1.

13. The thermosetting resin composition according to claim 12, wherein the thermosetting resin is one or more resins selected from among epoxy resins, silicone resins, silicone-epoxy hybrid resins and cyanate resins.

14. The thermosetting resin composition according to claim 12, comprising 50 to 1,200 parts by mass of the composite oxide particle (B) per 100 parts by mass of the thermosetting resin (A).

15. A thermosetting resin composition comprising:
(A) a thermosetting resin, and
(B) the spherical composite oxide particle according to claim 4.

16. The thermosetting resin composition according to claim 15, wherein the thermosetting resin is one or more resins selected from among epoxy resins, silicone resins, silicone-epoxy hybrid resins and cyanate resins.

17. The thermosetting resin composition according to claim 15, comprising 50 to 1,200 parts by mass of the spherical composite oxide particle (B) per 100 parts by mass of the thermosetting resin (A).

18. A reflector for a light-emitting semiconductor device, formed from the thermosetting resin composition according to claim 12.

19. A reflector for a light-emitting semiconductor device, formed from the thermosetting resin composition according to claim 15.

20. A light-emitting semiconductor device in which a light-emitting semiconductor element is installed on the reflector for a light-emitting semiconductor device according to claim 18.

21. A light-emitting semiconductor device in which a light-emitting semiconductor element is installed on the reflector for a light-emitting semiconductor device according to claim 19.

22. A light-emitting semiconductor device in which a light-emitting semiconductor element is encapsulated with the thermosetting resin composition according to claim 12.

23. A light-emitting semiconductor device in which a light-emitting semiconductor element is encapsulated with the thermosetting resin composition according to claim 15.

* * * * *